United States Patent
Ooi et al.

(10) Patent No.: US 9,082,683 B2
(45) Date of Patent: Jul. 14, 2015

(54) METHOD OF MANUFACTURING SILICON CARBIDE SEMICONDUCTOR DEVICE

(71) Applicant: Sumitomo Electric Industries, Ltd., Osaka (JP)

(72) Inventors: Naoki Ooi, Osaka (JP); Hiromu Shiomi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/147,257

(22) Filed: Jan. 3, 2014

(65) Prior Publication Data
US 2014/0120682 A1    May 1, 2014

Related U.S. Application Data

(63) Continuation of application No. 13/330,413, filed on Dec. 19, 2011, now Pat. No. 8,642,436.

(60) Provisional application No. 61/426,096, filed on Dec. 22, 2010.

(30) Foreign Application Priority Data

Dec. 22, 2010    (JP) ................. 2010-285277

(51) Int. Cl.
| | |
|---|---|
| H01L 21/336 | (2006.01) |
| H01L 29/16 | (2006.01) |
| H01L 29/66 | (2006.01) |
| H01L 29/78 | (2006.01) |
| H01L 21/04 | (2006.01) |

(52) U.S. Cl.
CPC .......... *H01L 29/1608* (2013.01); *H01L 21/047* (2013.01); *H01L 21/0465* (2013.01); *H01L 29/66068* (2013.01); *H01L 29/7802* (2013.01)
USPC .................. 438/308; 257/E21.409

(58) Field of Classification Search
None
See application file for complete search history.

(56) References Cited

U.S. PATENT DOCUMENTS

| | | | |
|---|---|---|---|
| 5,384,270 A | 1/1995 | Ueno | |
| 6,054,352 A | 4/2000 | Ueno | |

(Continued)

FOREIGN PATENT DOCUMENTS

| | | |
|---|---|---|
| CA | 2717077 A1 | 6/2010 |
| JP | 6-151860 A | 5/1994 |

(Continued)

OTHER PUBLICATIONS

Tanimoto, (English Machine Translation of JP2006128191).*

(Continued)

*Primary Examiner* — Seahvosh Nikmanesh
(74) *Attorney, Agent, or Firm* — Venable LLP; Michael A. Sartori; Tamatane J. Aga

(57) ABSTRACT

A first impurity region is formed by ion implantation through a first opening formed in a mask layer. By depositing a spacer layer on an etching stop layer on which the mask layer has been provided, a mask portion having the mask layer and the spacer layer is formed. By anisotropically etching the spacer layer, a second opening surrounded by a second sidewall is formed in the mask portion. A second impurity region is formed by ion implantation through the second opening. An angle of the second sidewall with respect to a surface is 90°±10° across a height as great as a second depth. Thus, accuracy in extension of an impurity region can be enhanced.

15 Claims, 15 Drawing Sheets

(56) References Cited

U.S. PATENT DOCUMENTS

| | | |
|---|---|---|
| 6,465,807 B1 | 10/2002 | Ueno |
| 7,029,969 B2 | 4/2006 | Tarui et al. |
| 7,285,465 B2 | 10/2007 | Tarui et al. |
| 7,608,499 B2 | 10/2009 | Romero et al. |
| 2004/0188755 A1 | 9/2004 | Tarui et al. |
| 2006/0134847 A1 | 6/2006 | Tarui et al. |
| 2010/0048004 A1 | 2/2010 | Hashimoto et al. |
| 2011/0001144 A1 | 1/2011 | Fujikawa et al. |
| 2011/0169016 A1 | 7/2011 | Wada et al. |
| 2013/0045593 A1 | 2/2013 | Oooi |

FOREIGN PATENT DOCUMENTS

| | | |
|---|---|---|
| JP | 10-233503 A | 9/1998 |
| JP | 2004-207492 A | 7/2004 |
| JP | 2004-319964 A | 11/2004 |
| JP | 2006-066439 A | 3/2006 |
| JP | 2006-128191 A | 5/2006 |
| JP | 2006-237511 A | 9/2006 |
| JP | 2007-273588 A | 10/2007 |
| JP | 2009-177006 A | 8/2009 |
| JP | 2010-166024 A | 7/2010 |
| JP | 2010-182762 A | 8/2010 |
| JP | 2010-267767 A | 11/2010 |
| WO | WO-2010/110252 A1 | 9/2010 |

OTHER PUBLICATIONS

Extended European Search Report issued in European Patent Application No. 11847884.1 dated May 26, 2014.

International Search Report and Written Opinion in PCT International Application No. PCT/JP2011/068140, dated Nov. 8, 2011.

* cited by examiner

METHOD OF MANUFACTURING SILICON CARBIDE SEMICONDUCTOR DEVICE

CROSS-REFERENCE TO RELATED APPLICATIONS

This application is a Continuation of U.S. patent application Ser. No. 13/330,413, filed Dec. 19, 2011, which claims the benefit of U.S. Patent Application No. 61/426,096, filed Dec. 22, 2010, and Japan Patent Application No. 2010-285277, filed Dec. 22, 2010, all of which are incorporated by reference in their entirety.

BACKGROUND OF THE INVENTION

1. Field of the Invention

The present invention relates to a method of manufacturing a silicon carbide semiconductor device.

2. Description of the Background Art

In manufacturing a semiconductor device, the step of selectively forming an impurity region in a semiconductor substrate is required. For example, in manufacturing an n-channel type MOSFET (Metal Oxide Semiconductor Field Effect Transistor), in order to obtain an npn structure, the step of partially forming a p-type impurity region in an n-type semiconductor substrate and further partially forming an n-type impurity region in this p-type impurity region is often performed. Namely, two impurity regions different in extension from each other are formed. In a case where a silicon substrate is employed, since extension of an impurity region can be adjusted by diffusion, a double diffusion technique utilizing this feature has widely been used. Meanwhile, in a case where a silicon carbide substrate is employed, a diffusion coefficient of an impurity is small and hence it is difficult to adjust extension of an impurity region by diffusion. Namely, a region into which ions have been implanted becomes an impurity region substantially as it is through activation annealing. Therefore, the double diffusion technique cannot be employed. Thus, for example according to Japanese Patent Laying-Open No. 6-151860 (Patent Literature 1), ions are implanted by using a gate electrode having an inclined surface at an end surface as a mask. By utilizing the fact that a range of impurity ions in ion implantation can be controlled by an acceleration voltage, a desired impurity region is formed.

In the method above, extension of an impurity region is largely dependent on accuracy in formation of an inclined surface of a gate electrode, and hence error in extension of the impurity becomes great.

SUMMARY OF THE INVENTION

The present invention was made in view of the problems above, and an object of the present invention is to provide a method of manufacturing a silicon carbide semiconductor device capable of enhancing accuracy in extension of an impurity region.

According to a method of manufacturing a silicon carbide semiconductor device of the present invention, the following steps are performed.

A silicon carbide substrate having a surface is prepared. An etching stop layer is formed on the surface of the silicon carbide substrate. A mask layer is deposited on the etching stop layer. In the mask layer, a first opening surrounded by a first sidewall is formed. A first impurity region having a first conductivity type is formed from the surface to a first depth in the silicon carbide substrate by ion implantation through the first opening. After the step of forming a first impurity region, by depositing a spacer layer on the etching stop layer on which the mask has been provided, a mask portion having the mask layer and the spacer layer is formed. The spacer layer covers the first sidewall and the etching stop layer in the first opening. By anisotropically etching the spacer layer in the first opening, a second opening surrounded by a second sidewall is formed in the mask portion. A second impurity region having a second conductivity type different from the first conductivity type is formed from the surface to a second depth smaller than the first depth in the silicon carbide substrate, by ion implantation through the second opening. An angle of the second sidewall with respect to the surface is $90°\pm10°$ across a height as great as the second depth. It is noted that "$90°\pm10°$" means $80°$ or greater and $100°$ or smaller.

According to the manufacturing method above, an angle of the second sidewall of the mask portion with respect to the surface of the silicon carbide substrate is $90°\pm10°$, that is, substantially perpendicular, across the height as great as the second depth of the second impurity region. Thus, in ion implantation for forming the second impurity region, substantially no region where the mask portion has a small thickness due to inclination of the second sidewall exists in the vicinity of the second sidewall. Therefore, introduction of ions into the silicon carbide substrate through the mask portion in the vicinity of the second sidewall can be suppressed. Thus, substantially no impurity region can be formed in a portion covered with the mask portion. Therefore, accuracy in extension of the second impurity region can be enhanced.

Preferably, the mask portion is removed after the second impurity region is formed. Thus, the portion covered with the mask portion in the silicon carbide substrate can be exposed. Further, preferably, a gate insulating film and a gate electrode are formed on the silicon carbide substrate after the mask portion is removed. Thus, a gate insulating film and a gate electrode free from change in quality due to exposure to ion implantation for forming the first and second impurity regions can be formed.

Preferably, an angle of the first sidewall with respect to the surface is $90°\pm10°$ across a height as great as the first depth. Thus, in ion implantation for forming the first impurity region, substantially no region where the mask portion has a small thickness due to inclination of the first sidewall exists in the vicinity of the first sidewall. Therefore, introduction of ions into the silicon carbide substrate through the mask portion in the vicinity of the first sidewall can be suppressed. Thus, substantially no impurity region can be formed in a portion covered with the mask portion. Therefore, accuracy in extension of the first impurity region can be enhanced.

Preferably, an ion implantation angle in the step of forming a second impurity region is not smaller than $0°$ and not greater than $6°$. Namely, ions are implanted substantially perpendicularly to the surface of the silicon carbide substrate. Thus, as compared with a case where an ion implantation angle is greater, introduction of ions into the silicon carbide substrate through the mask portion in the vicinity of the second sidewall can further be suppressed.

Preferably, the second sidewall includes a portion of which angle with respect to the surface of the silicon carbide substrate is $90°\pm10°$ and a height of this portion is not smaller than 0.5 μm and not greater than 2.5 μm. As this height is not smaller than 0.5 μm, introduction of ions into the silicon carbide substrate through the mask portion can further be suppressed. As this height is not greater than 2.5 μm, a thinner mask portion can be used and hence warpage of the silicon carbide substrate due to stress in the mask portion can be suppressed.

An ion implantation angle in the step of forming a second impurity region may be not smaller than 3° and not greater than 6°, and a surface of the silicon carbide substrate may be a (0-33-8) plane of a hexagonal crystal. As the surface of the silicon carbide substrate is the (0-33-8) plane of a hexagonal crystal, channel mobility of carriers at the surface can be enhanced. In addition, as the ion implantation angle is not smaller than 3°, channeling of implanted ions in the silicon carbide substrate can be suppressed.

An ion implantation angle in the step of forming a second impurity region may be 0°, and a surface of the silicon carbide substrate may be inclined by 3° or more from a {0001} plane of a hexagonal crystal in order to prevent a channeling phenomenon during ion implantation. As the ion implantation angle is 0°, introduction of ions into the silicon carbide substrate through the mask portion in the vicinity of the second sidewall can further be suppressed.

Preferably, the mask layer is made of any of silicon oxide and polysilicon. Preferably, the spacer layer is made of any of silicon oxide and polysilicon.

Preferably, a material for the etching stop layer is different from a material for the mask layer. Further preferably, the etching stop layer includes at least any of a silicon nitride layer, a polysilicon layer, a silicon oxide layer, a silicon oxynitride layer, and a titanium layer. Further preferably, the etching stop layer has a thickness not smaller than 10 nm and not greater than 500 nm. In a case where the etching stop layer includes a titanium layer, preferably, an underlying layer made of any of silicon oxide and polysilicon is provided between the titanium layer serving as the etching stop layer and the silicon carbide substrate.

As is clear from the description above, according to the present invention, accuracy in extension of an impurity region can be enhanced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawings.

First Embodiment

Figure 1:
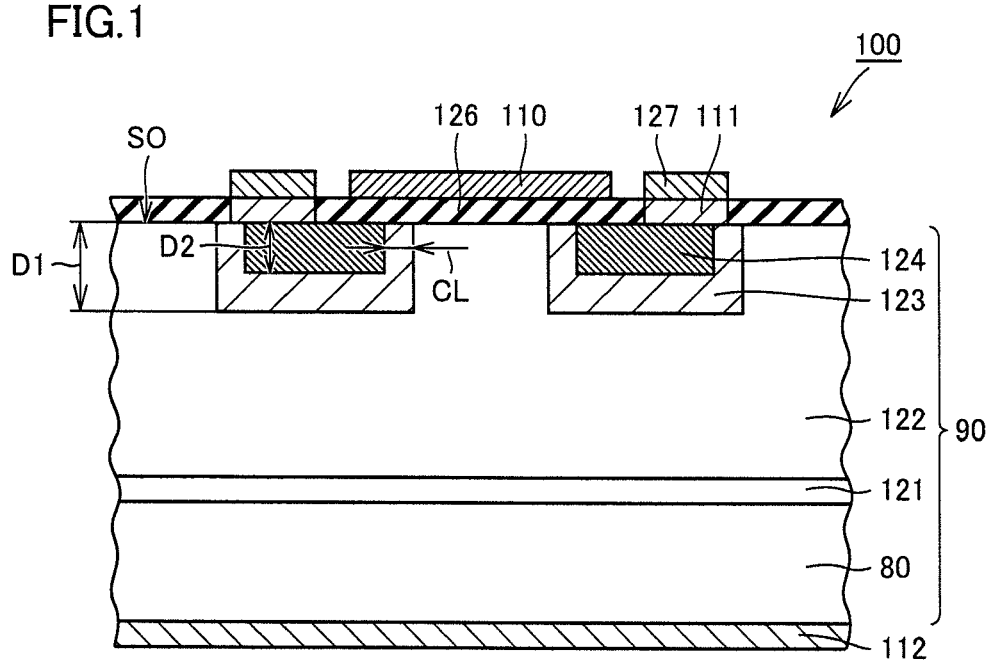
FIG. 1 is a partial cross-sectional view schematically showing a construction of a silicon carbide semiconductor device in a first embodiment of the present invention.

As shown in FIG. 1, a silicon carbide semiconductor device in the present embodiment is a MOSFET 100, and it is specifically a vertical DiMOSFET (Double Implanted MOSFET). MOSFET 100 has an epitaxial substrate 90, an oxide film 126, a source electrode 111, an upper source electrode 127, a gate electrode 110, and a drain electrode 112. Epitaxial substrate 90 has a single crystal substrate 80, a buffer layer 121, a breakdown voltage holding layer 122, a p region 123, and an $n^+$ region 124. A two-dimensional shape (a shape when viewed from above in FIG. 1) of MOSFET 100 is for example, a rectangle or a square having a side of a length not shorter than 2 mm.

Single crystal substrate 80 and buffer layer 121 each have an n conductivity type. Single crystal substrate 80 is preferably composed of silicon carbide. Concentration of an n-type conductive impurity in buffer layer 121 is, for example, $5 \times 10^{17}$ $cm^{-3}$. In addition, buffer layer 121 has a thickness, for example, of 0.5 μm.

Breakdown voltage holding layer 122 is formed on buffer layer 121, and it is composed of silicon carbide having an n conductivity type. For example, breakdown voltage holding layer 122 has a thickness of 10 μm and concentration of an n-type conductive impurity is $5 \times 10^{15}$ $cm^{-3}$.

On a surface SO of epitaxial substrate 90, a plurality of p regions 123 having a p conductivity type are formed at a distance from one another. In addition, in surface SO, $n^+$ region 124 is formed to be located inside each p region 123. In surface SO, p region 123 has a channel region lying between $n^+$ region 124 and breakdown voltage holding layer 122 and covered with gate electrode 110 with oxide film 126 being interposed. The channel region has a channel length CL.

On breakdown voltage holding layer 122 exposed between the plurality of p regions 123 at surface SO, oxide film 126 is formed. Specifically, oxide film 126 is formed to extend from $n^+$ region 124 in one p region 123 to p region 123, breakdown voltage holding layer 122 exposed between two p regions 123, the other p region 123, and $n^+$ region 124 in the other p region 123. Gate electrode 110 is formed on oxide film 126. Therefore, a portion of oxide film 126 having gate electrode 110 formed thereon has a function as a gate insulating film. In addition, source electrode 111 is formed on $n^+$ region 124. A part of source electrode 111 may be in contact with p region 123. Upper source electrode 127 is formed on source electrode 111.

A method of manufacturing MOSFET 100 will now be described.

Figure 2:
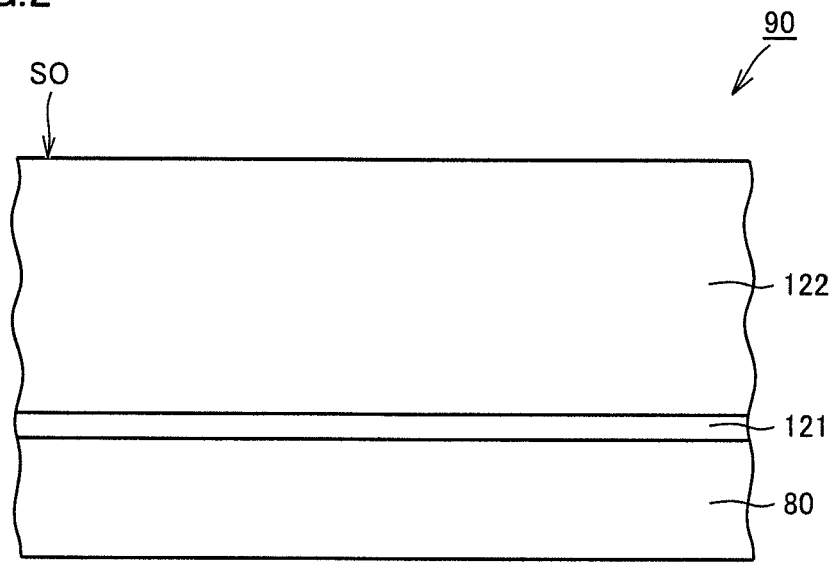
FIG. 2 is a partial cross-sectional view schematically showing a first step in a method of manufacturing a silicon carbide semiconductor device in FIG. 1.

As shown in FIG. 2, epitaxial substrate 90 (silicon carbide substrate) having surface SO is prepared. Specifically, buffer layer 121 is formed on a main surface of single crystal substrate 80, and breakdown voltage holding layer 122 is formed on buffer layer 121. Buffer layer 121 is composed of silicon carbide having an n conductivity type, and it has a thickness, for example, of 0.5 μm. In addition, concentration of the conductive impurity in buffer layer 121 is set, for example, to $5 \times 10^{17}$ $cm^{-3}$. Breakdown voltage holding layer 122 has a thickness, for example, of 10 μm. Further, concentration of the n conductive impurity in breakdown voltage holding layer 122 is set, for example, to $5 \times 10^{15}$ $cm^{-3}$.

Figure 3:
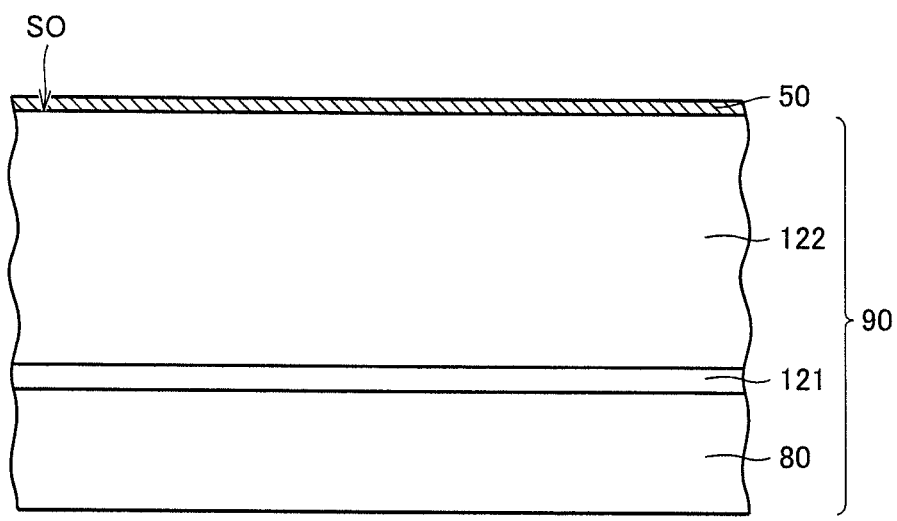
FIG. 3 is a partial cross-sectional view schematically showing a second step in the method of manufacturing a silicon carbide semiconductor device in FIG. 1.

As shown in FIG. 3, an etching stop layer 50 is formed on surface SO of epitaxial substrate 90. Preferably, a material for etching stop layer 50 is different from a material for a mask layer 31 (FIG. 4) which will be described later. Preferably, etching stop layer 50 is a silicon nitride layer or a titanium layer. The titanium layer has a thickness, for example, not smaller than 50 nm and not greater than 200 nm.

Figure 4:
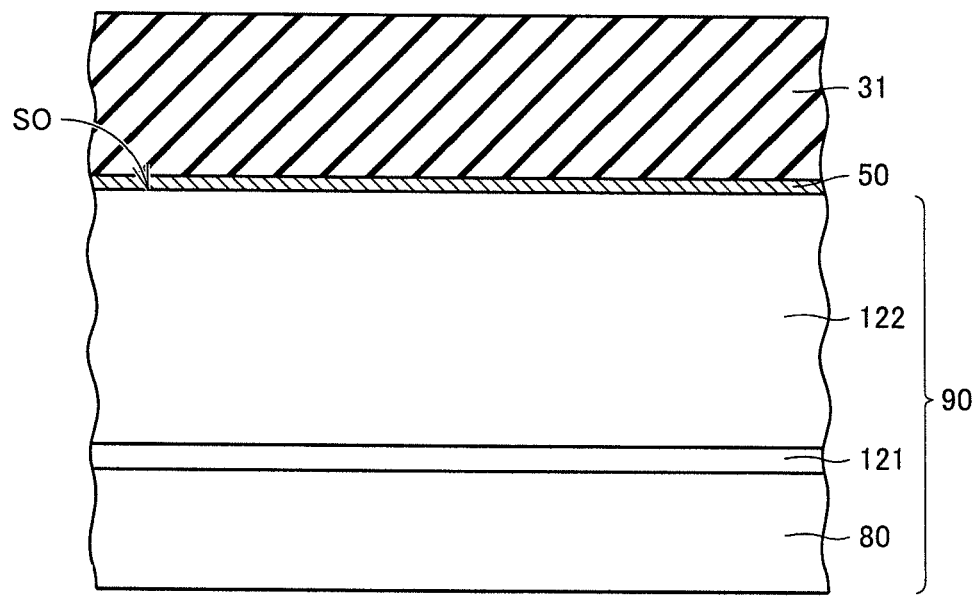
FIG. 4 is a partial cross-sectional view schematically showing a third step in the method of manufacturing a silicon carbide semiconductor device in FIG. 1.

As shown in FIG. 4, mask layer 31 is deposited on etching stop layer 50. Preferably, mask layer 31 is made of any of silicon oxide and polysilicon.

Figure 5:
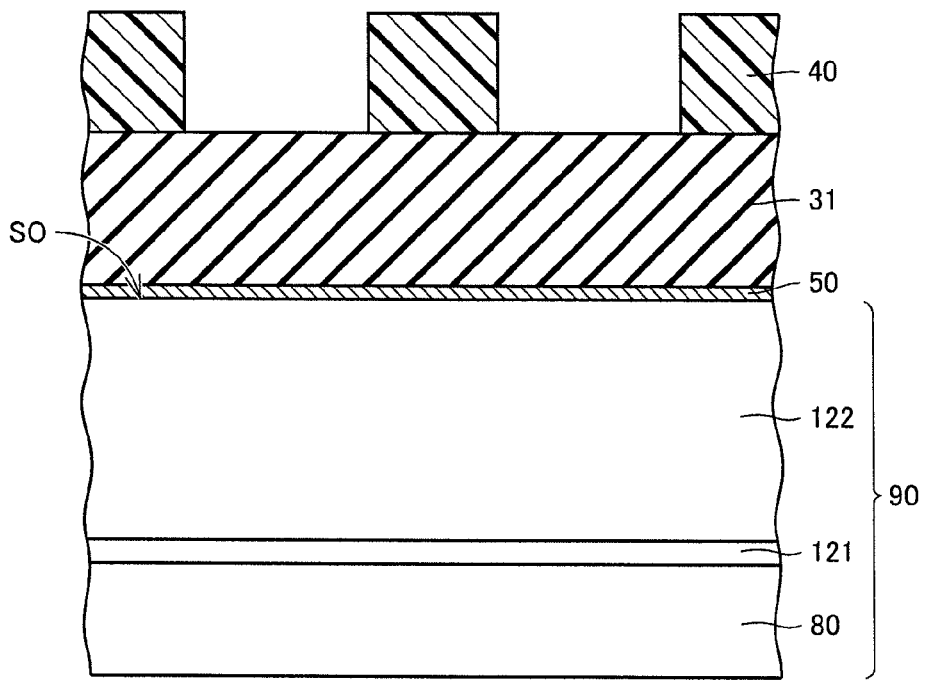
FIG. 5 is a partial cross-sectional view schematically showing a fourth step in the method of manufacturing a silicon carbide semiconductor device in FIG. 1.

As shown in FIG. 5, a photoresist pattern 40 is formed on mask layer 31.

Figure 6:
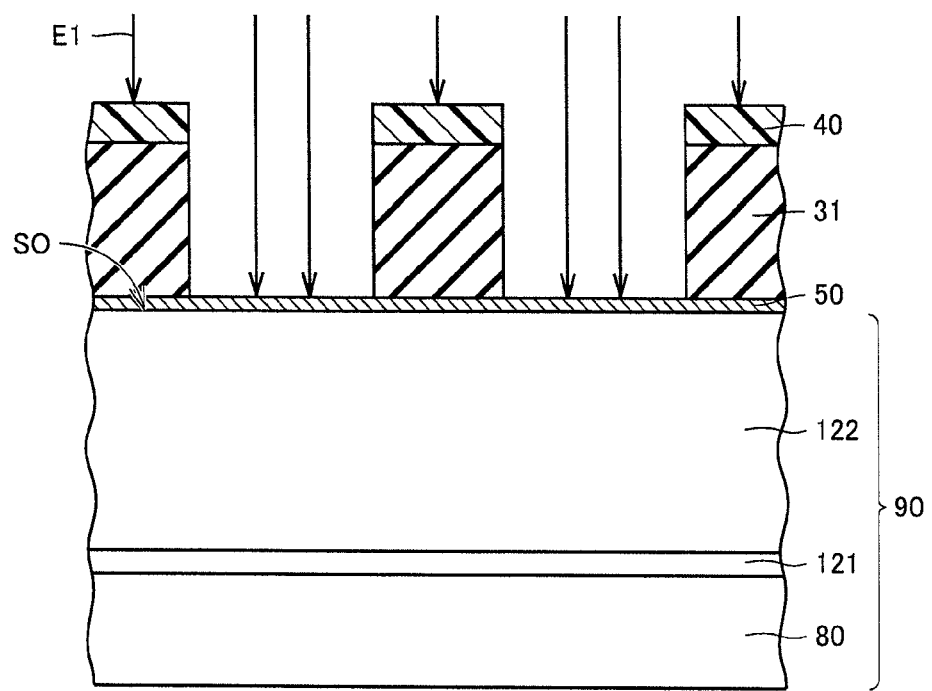
FIG. 6 is a partial cross-sectional view schematically showing a fifth step in the method of manufacturing a silicon carbide semiconductor device in FIG. 1.

As shown in FIG. 6, mask layer 31 is patterned through anisotropic etching E1 using photoresist pattern 40 as a mask. Remaining photoresist pattern 40 is removed.

Figure 7:
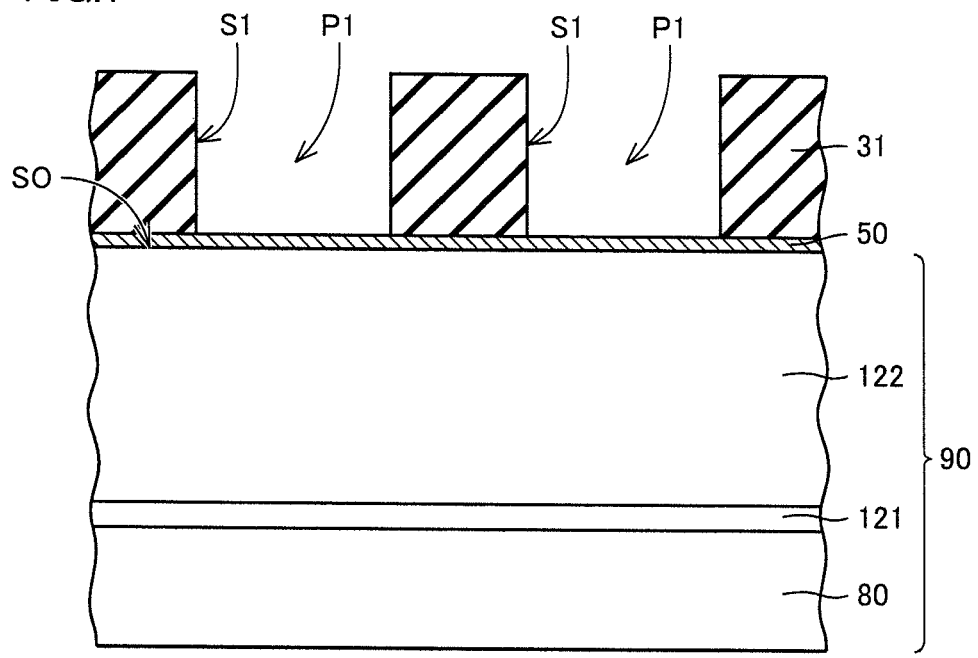
FIG. 7 is a partial cross-sectional view schematically showing a sixth step in the method of manufacturing a silicon carbide semiconductor device in FIG. 1.

As shown in FIG. 7, as a result of etching above, an opening P1 (a first opening) surrounded by a sidewall S1 (a first sidewall) is formed in mask layer 31.

Figure 8:
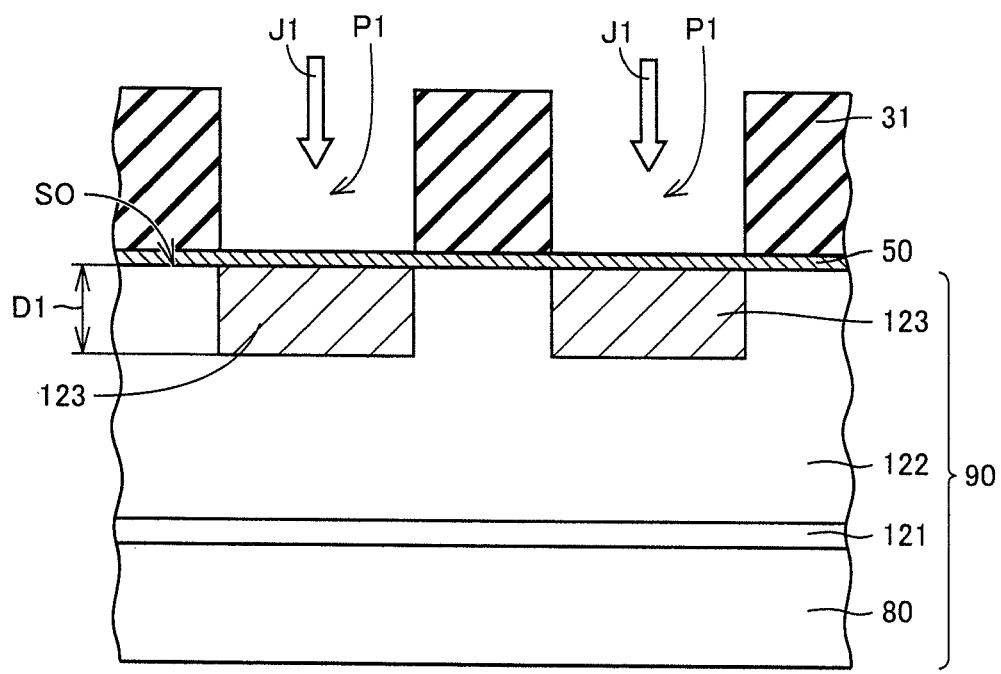
FIG. 8 is a partial cross-sectional view schematically showing a seventh step in the method of manufacturing a silicon carbide semiconductor device in FIG. 1.

As shown in FIG. 8, as a result of ion implantation J1 through opening P1, p region 123 (a first impurity region) having p-type (the first conductivity type) is formed from surface SO to a depth D1 (a first depth) in epitaxial substrate 90.

Figure 9:
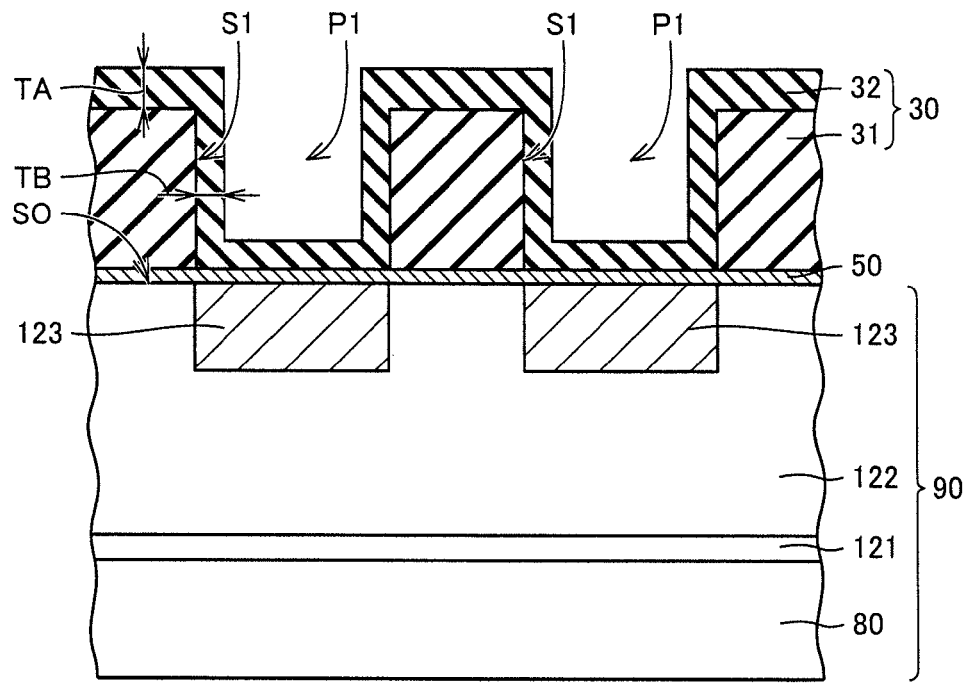
FIG. 9 is a partial cross-sectional view schematically showing an eighth step in the method of manufacturing a silicon carbide semiconductor device in FIG. 1.

As shown in FIG. 9, thereafter by depositing a spacer layer 32 on etching stop layer 50 on which mask layer 31 has been provided, a mask portion 30 having mask layer 31 and spacer layer 32 is formed. Spacer layer 32 covers sidewall S1 and etching stop layer 50 in opening P1. Preferably, spacer layer 32 is made of any of silicon oxide and polysilicon.

Figure 10:
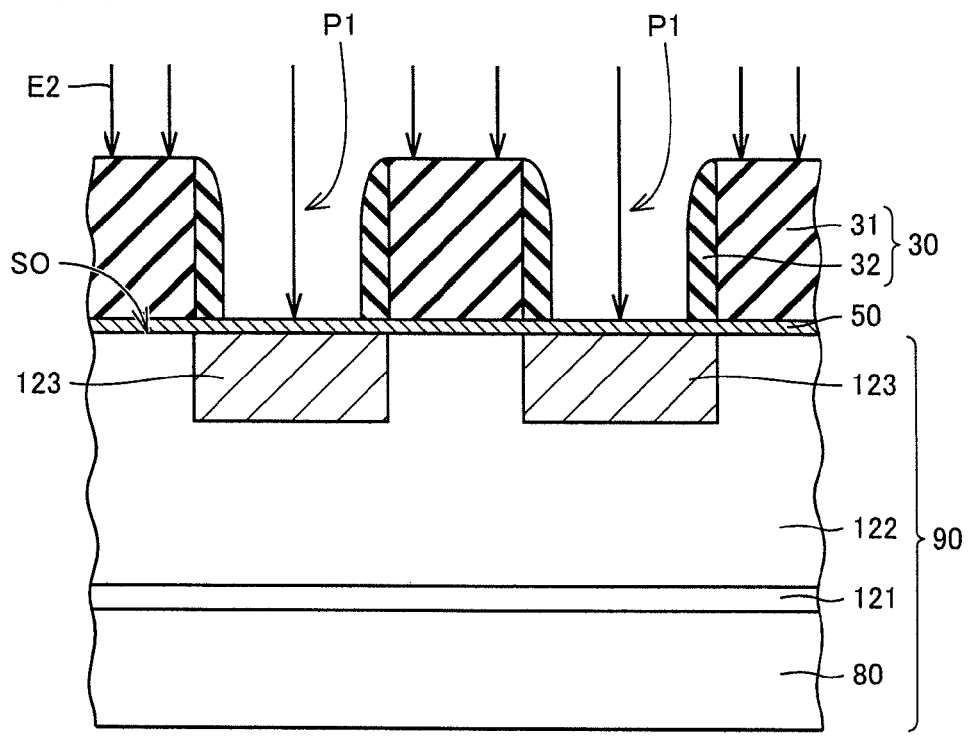
FIG. 10 is a partial cross-sectional view schematically showing a ninth step in the method of manufacturing a silicon carbide semiconductor device in FIG. 1.

As shown in FIG. 10, spacer layer 32 in opening P1 is patterned by anisotropic etching E2.

Figure 11:
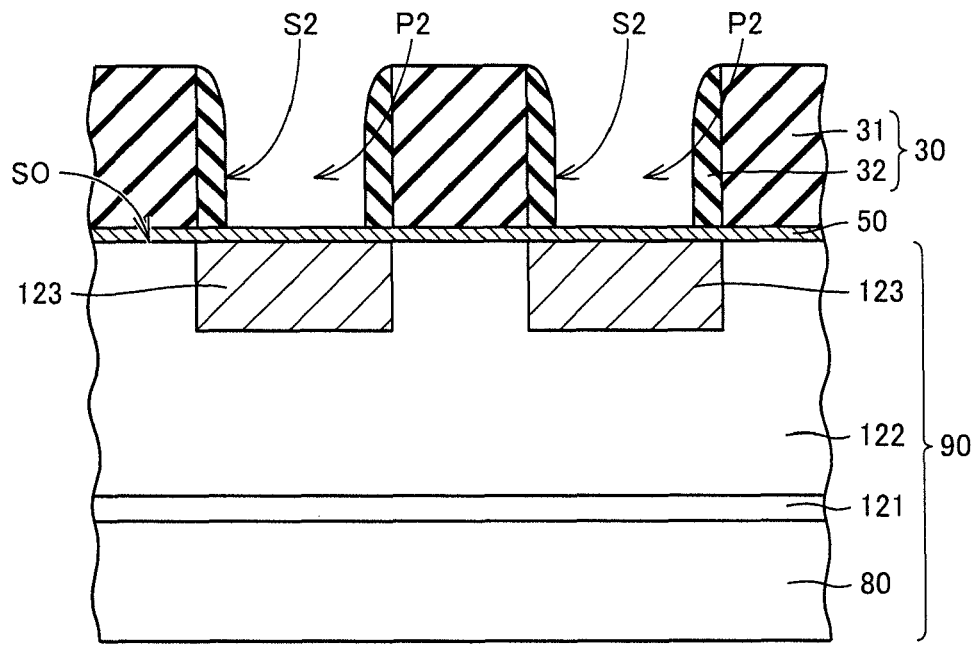
FIG. 11 is a partial cross-sectional view schematically showing a tenth step in the method of manufacturing a silicon carbide semiconductor device in FIG. 1.

As shown in FIG. 11, an opening P2 (a second opening) surrounded by a sidewall S2 (a second sidewall) is thus formed in mask portion 30.

Figure 12:
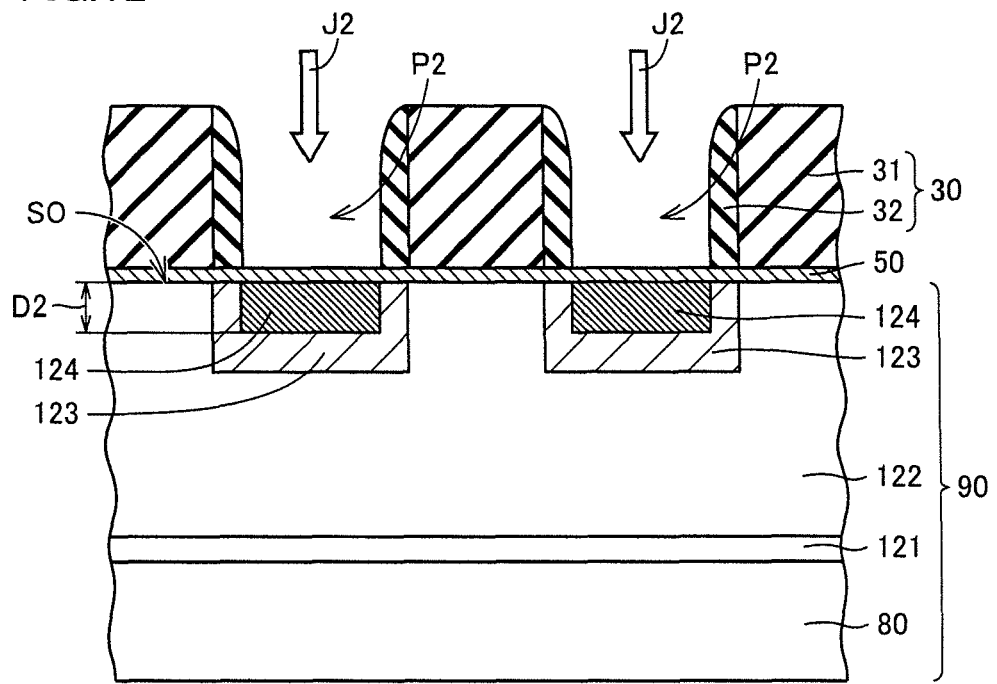
FIG. 12 is a partial cross-sectional view schematically showing an eleventh step in the method of manufacturing a silicon carbide semiconductor device in FIG. 1.
Figure 16:
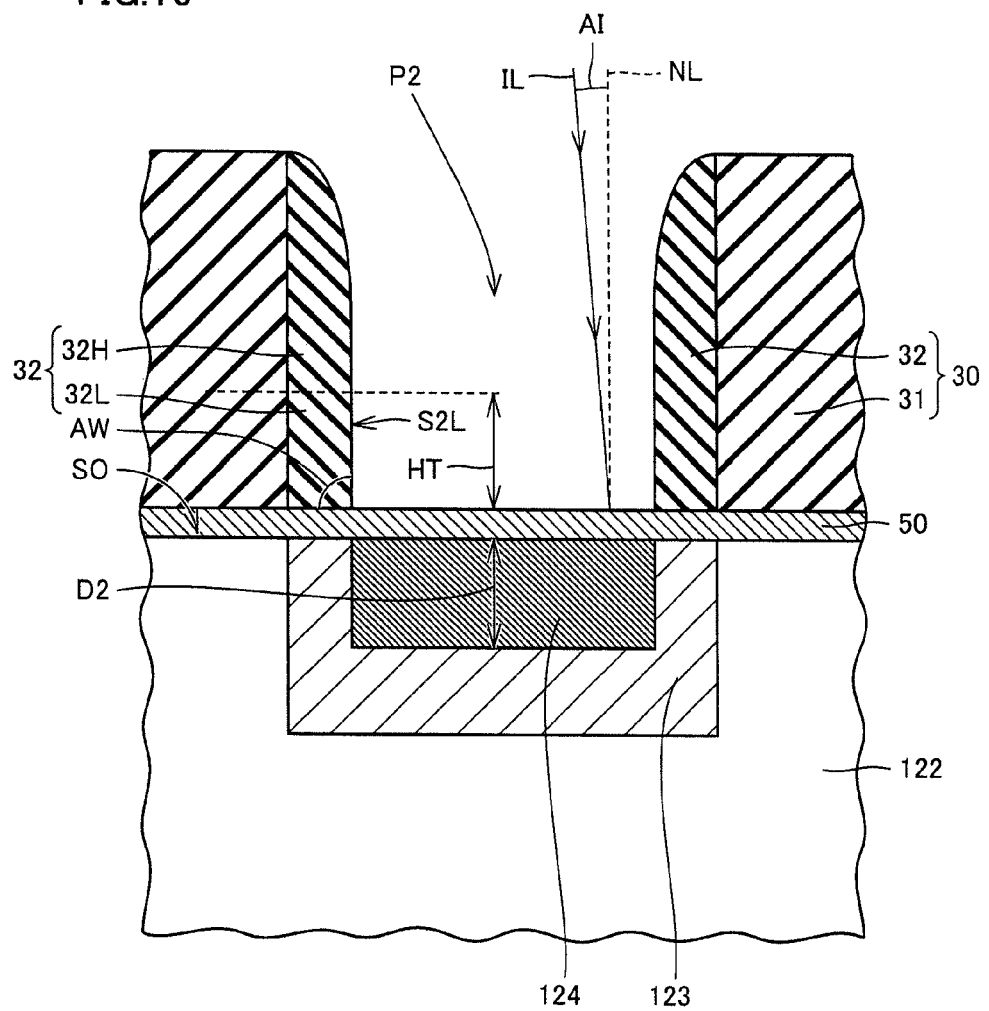
FIG. 16 is a partially enlarged view of FIG. 12.

As shown in FIG. 12, as a result of ion implantation J2 through opening P2, $n^+$ region 124 (a second impurity region) having n-type (the second conductivity type) is formed from surface SO to a depth D2 (a second depth) smaller than depth D1 in epitaxial substrate 90. As shown in FIG. 16 in further detail, an angle AW of an entire portion S2L of sidewall S2 (FIG. 11) across a height HT with respect to surface SO is 90°±10° and preferably 90°±5°. Height HT is equal to or greater than depth D2.

As described above, sidewall S2 includes a portion of which angle AW with respect to surface SO is 90°±10°. The height of this portion is preferably not smaller than 0.5 μm and not greater than 2.5 μm.

In addition, in a case where sidewall S2 includes a portion of which angle AW with respect to surface SO is 90°±5°, the height of this portion is preferably not smaller than 0.5 μm and not greater than 2.5 μm.

Preferably, an angle of sidewall S1 (FIG. 7) with respect to surface SO is 90°±10° and preferably 90°±5° across a height as great as depth D1 (FIG. 8).

Preferably, as shown in FIG. 16, an angle between a direction of travel IL of ion beams during ion implantation J2 (FIG. 12) and a normal NL of surface SO, that is, an ion implantation angle AI, is not smaller than 0° and not greater than 6°. Ion implantation angle AI in the step of forming $n^+$ region 124 may be not smaller than 3° and not greater than 6° and surface SO of epitaxial substrate 90 may be a (0-33-8) plane of a hexagonal crystal. In addition, ion implantation angle AI in the step of forming $n^+$ region 124 may be 0° and surface SO of epitaxial substrate 90 may be inclined by an angle not smaller than 3° and not greater than 6° from a {0001} plane of a hexagonal crystal in order to prevent a channeling phenomenon during ion implantation.

Figure 13:
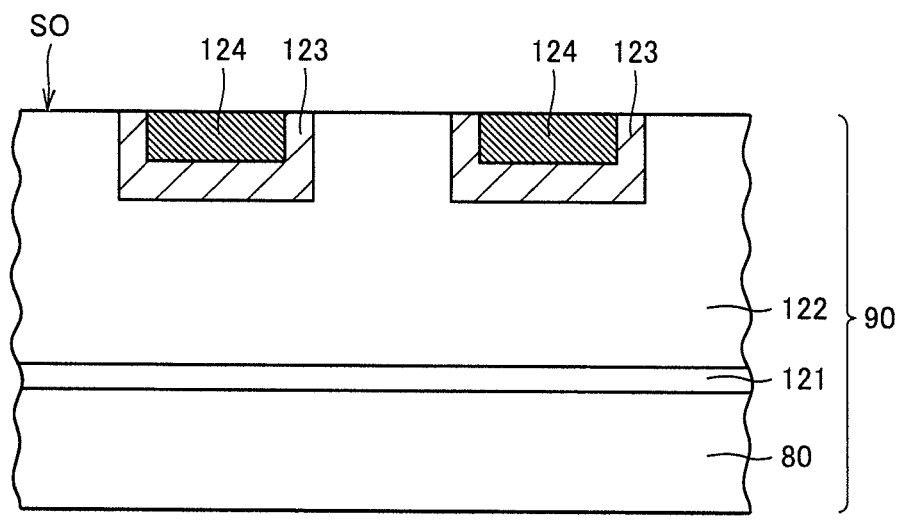
FIG. 13 is a partial cross-sectional view schematically showing a twelfth step in the method of manufacturing a silicon carbide semiconductor device in FIG. 1.

As further shown in FIG. 13, thereafter, mask portion 30 and etching stop layer 50 are removed. In addition, activation annealing treatment is performed. For example, annealing for 30 minutes at a heating temperature of 1700° C. in an argon atmosphere is performed.

Figure 14:
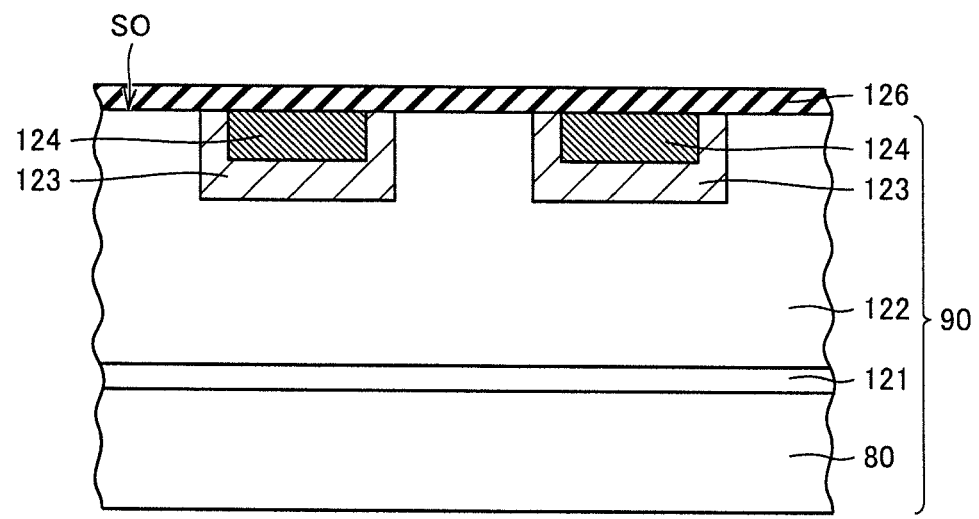
FIG. 14 is a partial cross-sectional view schematically showing a thirteenth step in the method of manufacturing a silicon carbide semiconductor device in FIG. 1.

As shown in FIG. 14, oxide film 126 having a function as a gate insulating film is formed on epitaxial substrate 90. Specifically, oxide film 126 is formed to cover breakdown voltage holding layer 122, p region 123, and n+ region 124. Formation may be carried out by dry oxidation (thermal oxidation). Conditions in dry oxidation are, for example, a heating temperature of 1200° C. and a heating time period of 30 minutes.

Thereafter, a nitriding annealing step is performed. Specifically, annealing treatment in a nitrogen monoxide (NO) atmosphere is performed. Conditions in this treatment are, for example, a heating temperature of 1100° C. and a heating time period of 120 minutes. Consequently, nitrogen atoms are introduced in the vicinity of an interface between each of breakdown voltage holding layer 122, p region 123 and n+ region 124 and oxide film 126. It is noted that, after this annealing step using nitrogen monoxide, annealing treatment using an argon (Ar) gas which is an inert gas may further be performed. Conditions in this treatment are, for example, a heating temperature of 1100° C. and a heating time period of 60 minutes.

Figure 15:
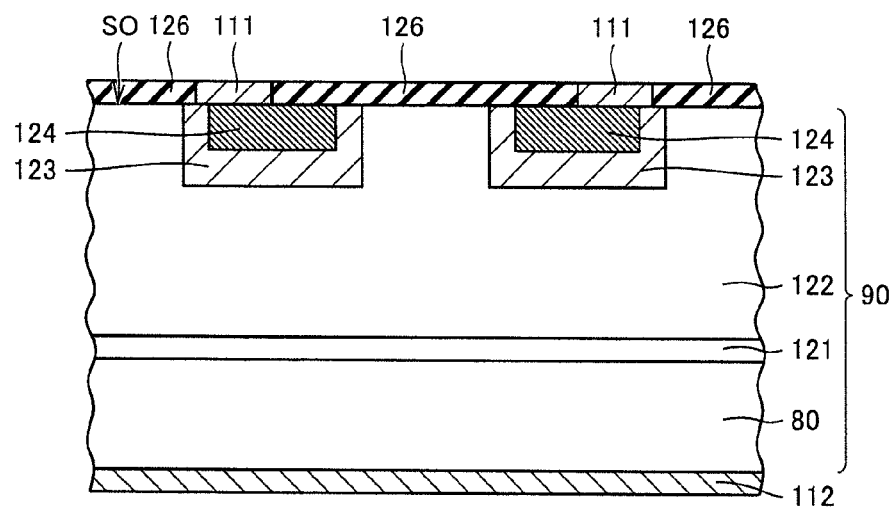
FIG. 15 is a partial cross-sectional view schematically showing a fourteenth step in the method of manufacturing a silicon carbide semiconductor device in FIG. 1.

As shown in FIG. 15, source electrode 111 is formed as follows.

A resist film having a pattern is formed on oxide film 126 with photolithography. Using this resist film as a mask, a portion of oxide film 126 located on n+ region 124 is etched away. Thus, an opening is formed in oxide film 126. Then, a conductor film is formed in this opening to be in contact with n+ region 124. Then, by removing the resist film, a portion of the conductor film above that has been located on the resist film is removed (lift-off). This conductor film may be a metal film and it is composed, for example, of nickel (Ni). As a result of this lift-off, source electrode 111 is formed.

It is noted that heat treatment for alloying is preferably performed here. For example, heat treatment for 2 minutes at a heating temperature of 950° C. in an atmosphere of an argon (Ar) gas which is an inert gas is performed.

Referring again to FIG. 1, upper source electrode 127 is formed on source electrode 111. In addition, gate electrode 110 is formed on oxide film 126. Moreover, drain electrode 112 is formed on a back surface (a lower surface in the drawing) of single crystal substrate 80.

MOSFET 100 (FIG. 1) is obtained as described above.

According to the present embodiment, as shown in FIG. 16, angle AW of sidewall S2 (FIG. 11) of mask portion 30 with respect to surface SO of epitaxial substrate 90 is 90°±10° across height HT as great as depth D2 of n+ region 124. Thus, during ion implantation for forming n+ region 124, substantially no region where mask portion 30 has a small thickness due to inclination of sidewall S2 exists in the vicinity of sidewall S2. Therefore, introduction of ions into epitaxial substrate 90 through mask portion 30 in the vicinity of sidewall S2 can be suppressed. Thus, substantially no n+ region 124 can be formed in a portion covered with mask portion 30. Therefore, accuracy in extension of n+ region 124 can be enhanced. In particular, accuracy in channel length CL (FIG. 1) can be enhanced.

Preferably, mask portion 30 is removed after n+ region 124 is formed. Thus, a portion of epitaxial substrate 90 that has been covered with mask portion 30 can be exposed. Further preferably, after mask portion 30 is removed, oxide film 126 (a gate insulating film) and gate electrode 110 are formed on epitaxial substrate 90. Thus, a gate insulating film and a gate electrode free from change in quality due to exposure to ion implantation for forming p region 123 and n+ region 124 can be formed.

Preferably, an angle of sidewall S1 (FIG. 7) with respect to surface SO is 90°±10° across the height as great as depth D1. Thus, during ion implantation for forming p region 123, substantially no region where mask portion 30 has a small thickness due to inclination of sidewall S1 exists in the vicinity of sidewall S1. Therefore, introduction of ions into epitaxial substrate 90 through mask portion 30 in the vicinity of sidewall S1 can be suppressed. Thus, substantially no p region 123 can be formed in the portion covered with mask portion 30. Therefore, accuracy in extension of p region 123 can be enhanced.

Preferably, as shown in FIG. 16, ion implantation angle AI in the step of forming n+ region 124 is not smaller than 0° and not greater than 6°. Thus, as compared with a case where an ion implantation angle is greater, introduction of ions into epitaxial substrate 90 through mask portion 30 in the vicinity of sidewall S2 (FIG. 11) can further be suppressed.

Preferably, as shown in FIG. 16, sidewall S2 (FIG. 11) includes a portion of which angle AW with respect to surface SO of epitaxial substrate 90 is 90°±10° and a height of this portion is not smaller than 0.5 μm and not greater than 2.5 μm. As this height is not smaller than 0.5 μm, introduction of ions into epitaxial substrate 90 through mask portion 30 can further be suppressed. As this height is not greater than 2.5 μm, warpage of the silicon carbide substrate due to stress in mask portion 30 can be suppressed.

Ion implantation angle AI (FIG. 16) in the step of forming n+ region 124 may be not smaller than 3° and not greater than 6°, and surface SO of epitaxial substrate 90 may be a (0-33-8) plane of a hexagonal crystal. As surface SO of epitaxial substrate 90 is the (0-33-8) plane of a hexagonal crystal, channel mobility of carriers at surface SO can be enhanced. In addition, as ion implantation angle AI is not smaller than 3°, channeling of implanted ions in epitaxial substrate 90 can be suppressed.

Ion implantation angle AI (FIG. 16) in the step of forming n+ region 124 may be 0°, and surface SO of epitaxial substrate 90 may be inclined by 3° or more from a {0001} plane of a hexagonal crystal in order to prevent a channeling phenomenon during ion implantation. As ion implantation angle AI is 0°, introduction of ions into epitaxial substrate 90 through mask portion 30 in the vicinity of sidewall S2 can further be suppressed.

Figure 17:
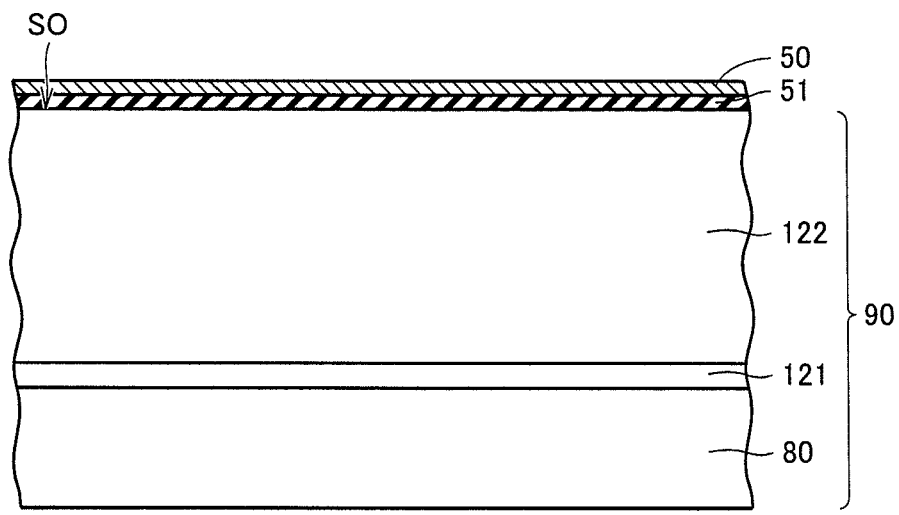
FIG. 17 is a partial cross-sectional view schematically showing a variation of the step in FIG. 3.

As a variation of the step in FIG. 3, an underlying layer 51 (FIG. 17) made of any of silicon oxide and polysilicon may be provided between a titanium layer serving as etching stop layer 50 and epitaxial substrate 90. Underlying layer 51 can prevent contamination of epitaxial substrate 90 by the titanium layer, that is, the metal layer.

Though a silicon nitride layer or a titanium layer is exemplified as the etching stop layer in the present embodiment, the construction of the etching stop layer is not limited thereto. The etching stop layer may be, for example, any of a silicon nitride layer, a polysilicon layer, a silicon oxide layer, a silicon oxynitride layer, and a titanium layer, or a layer made of a stack including at least any of these layers, or a layer made of a stack including two or more of these layers. A lower limit of a thickness of the etching stop layer is preferably 10 nm, more preferably 30 nm, and further preferably 50 nm. Meanwhile, an upper limit of a thickness of the etching stop layer is preferably 500 nm, more preferably 400 nm, and further preferably 300 nm.

Second Embodiment

Figure 18:
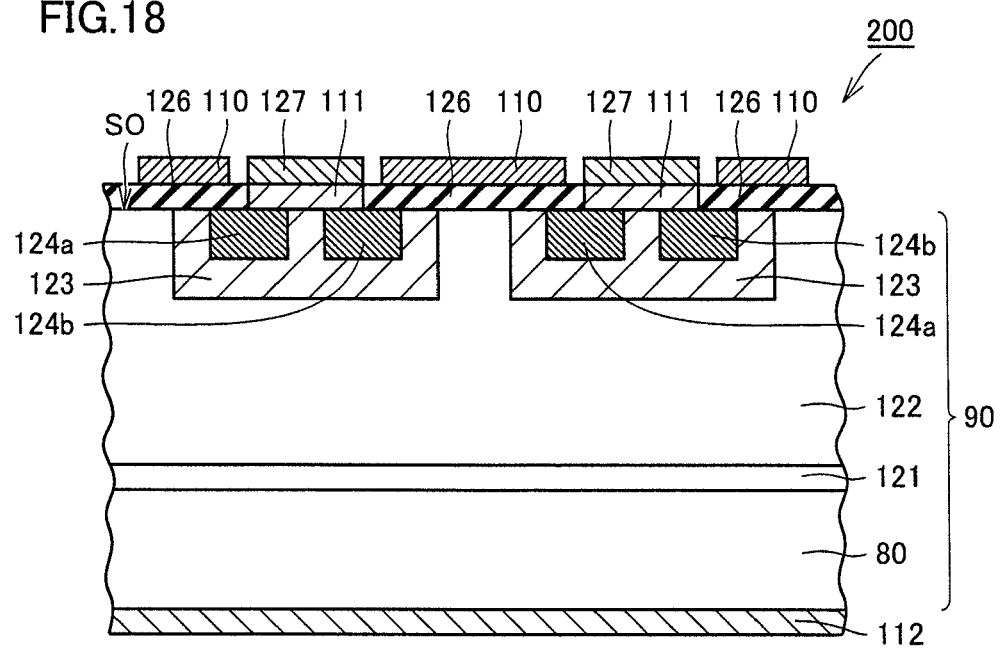
FIG. 18 is a partial cross-sectional view schematically showing a construction of a silicon carbide semiconductor device in a second embodiment of the present invention.

As shown in FIG. 18, a silicon carbide semiconductor device in the present embodiment is a MOSFET 200 and specifically a vertical DiMOSFET. MOSFET 200 has an n+ region 124a and an n+ region 124b instead of n+ region 124 (FIG. 1). N+ region 124a and n+ region 124b are arranged in surface SO at a distance from each other. P region 123 between n+ region 124a and n+ region 124b reaches surface SO and is in contact with source electrode 111.

A method of manufacturing MOSFET 200 will now be described. It is noted that the process is similarly performed also in the present embodiment until the step in FIG. 9 in the manufacturing method in the first embodiment.

Figure 19:
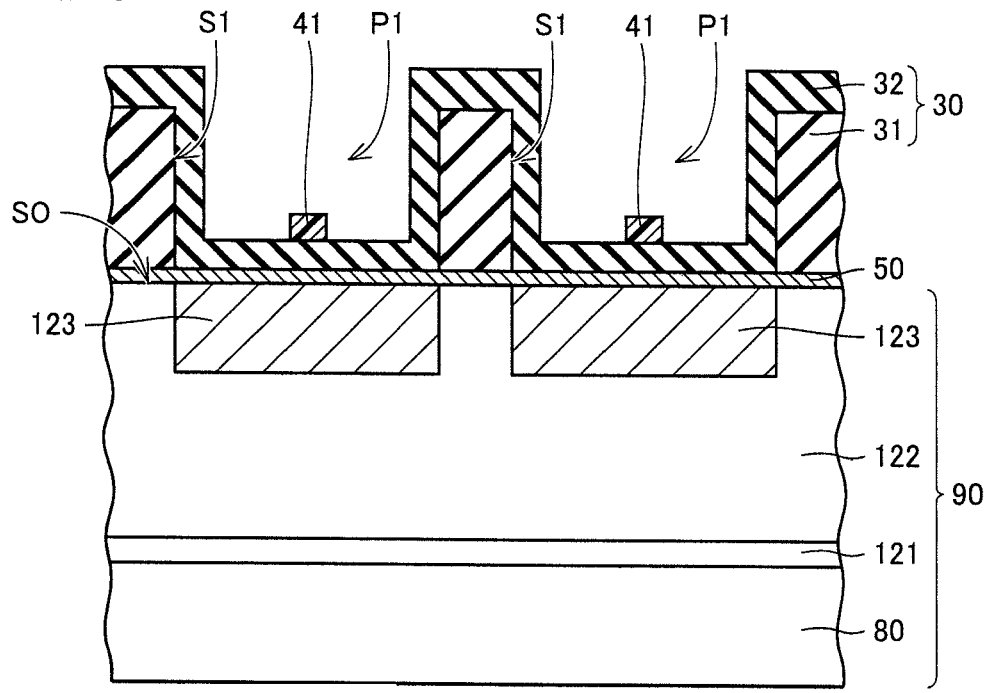
FIG. 19 is a partial cross-sectional view schematically showing a first step in a method of manufacturing a silicon carbide semiconductor device in the second embodiment of the present invention.

As shown in FIG. 19, in opening P1, a photoresist pattern 41 is formed on spacer layer 32 so as to be arranged at a distance from sidewall S1.

Figure 20:
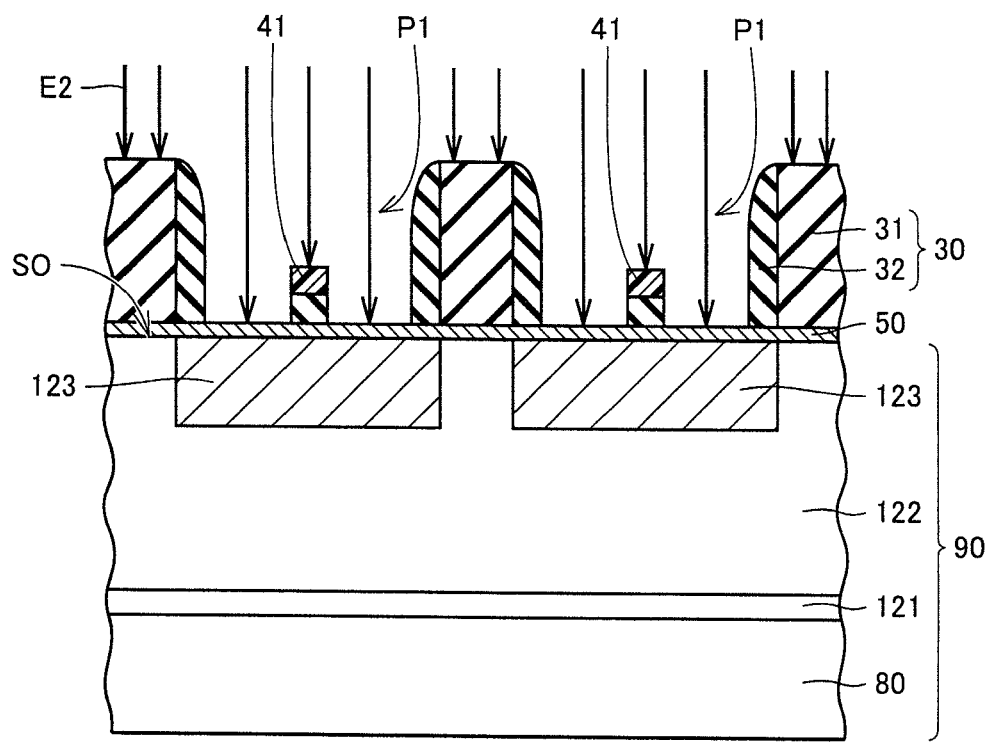
FIG. 20 is a partial cross-sectional view schematically showing a second step in the method of manufacturing a silicon carbide semiconductor device in the second embodiment of the present invention.

As shown in FIG. 20, spacer layer 32 in opening P1 is patterned by anisotropic etching E2, using photoresist pattern 41 as a mask. Remaining photoresist pattern 41 is removed.

Figure 21:
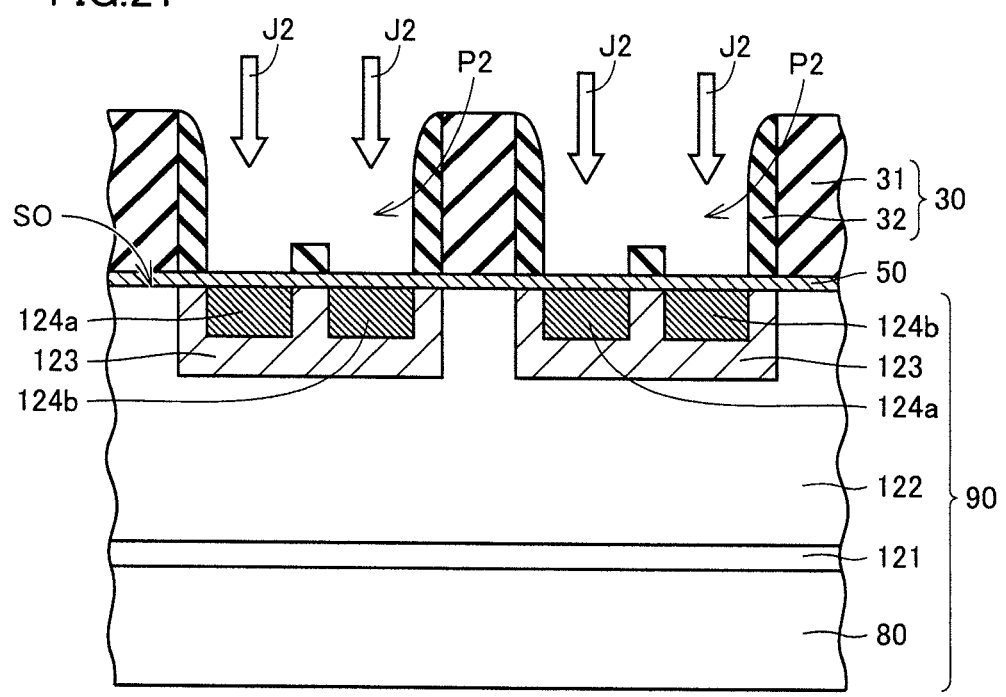
FIG. 21 is a partial cross-sectional view schematically showing a third step in the method of manufacturing a silicon carbide semiconductor device in the second embodiment of the present invention.

As shown in FIG. 21, as a result of ion implantation J2 through a portion of opening P2 from which spacer layer 32 has been removed, n+ regions (the second impurity regions) 124a and 124b having n-type (the second conductivity type) are formed. It is noted that each of n+ regions 124a and 124b has a depth equal to depth D2 of n+ region 124 (FIG. 16), and in the present embodiment as well, during ion implantation J2, sidewall S2 has portion S2L (FIG. 16) as in the first embodiment.

Since the construction other than the above is substantially the same as in the first embodiment described above, the same or corresponding elements have the same reference characters allotted and description thereof will not be repeated.

According to the present embodiment, as shown in FIG. 18, p region 123 between n+ region 124a and n+ region 124b reaches surface SO and is in contact with source electrode 111. According to this construction, a potential of p region 123 is stabilized.

In addition, a mask for isolating n+ region 124a and n+ region 124b is formed independently of patterning (FIG. 6) of mask layer 31. Therefore, difficulty in patterning of mask layer 31 does not become high.

Third Embodiment

Figure 22:
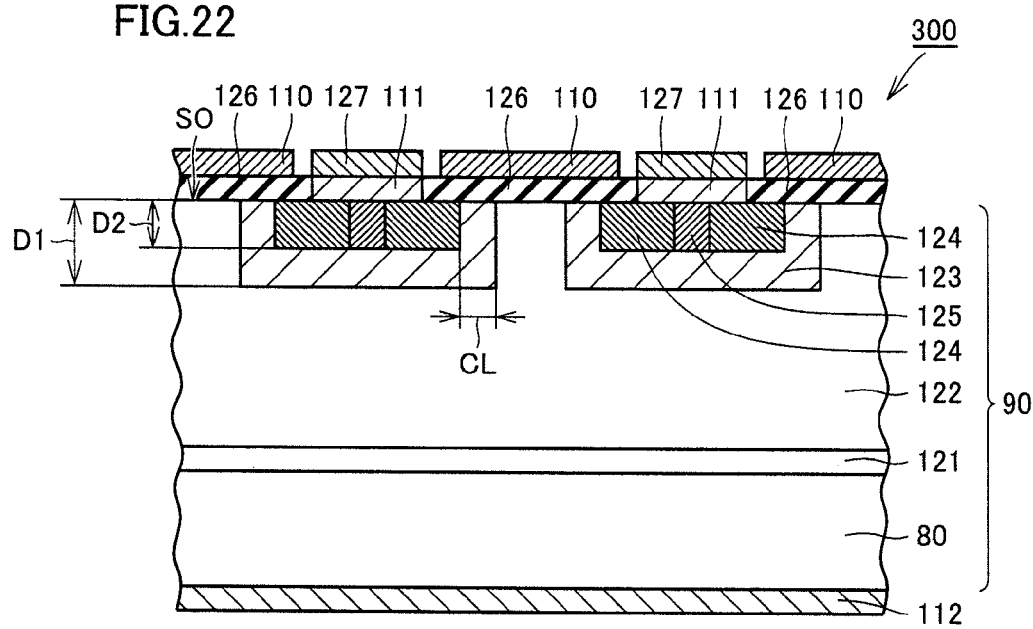
FIG. 22 is a partial cross-sectional view schematically showing a construction of a silicon carbide semiconductor device in a third embodiment of the present invention.

As shown in FIG. 22, epitaxial substrate 90 in a MOSFET 300 in the present embodiment has a p+ region 125 (a third impurity region). P+ region 125 connects surface SO and p region 123 to each other. In addition, p+ region 125 is higher in impurity concentration than p region 123. Preferably, p+ region 125 is formed to penetrate n+ region 124 to reach p region 123. Source electrode 111 is formed on n+ region 124 and p+ region 125.

As in the first embodiment, in surface SO, p region 123 forms a channel region having channel length CL. Channel length CL is preferably not smaller than 0.1 μm and not greater than 1.5 μm.

A method of manufacturing MOSFET 300 will now be described. Since the former part of the manufacturing method is substantially the same as the first to twelfth steps (FIGS. 2 to 13) in the first embodiment, description thereof will not be provided.

Figure 23:
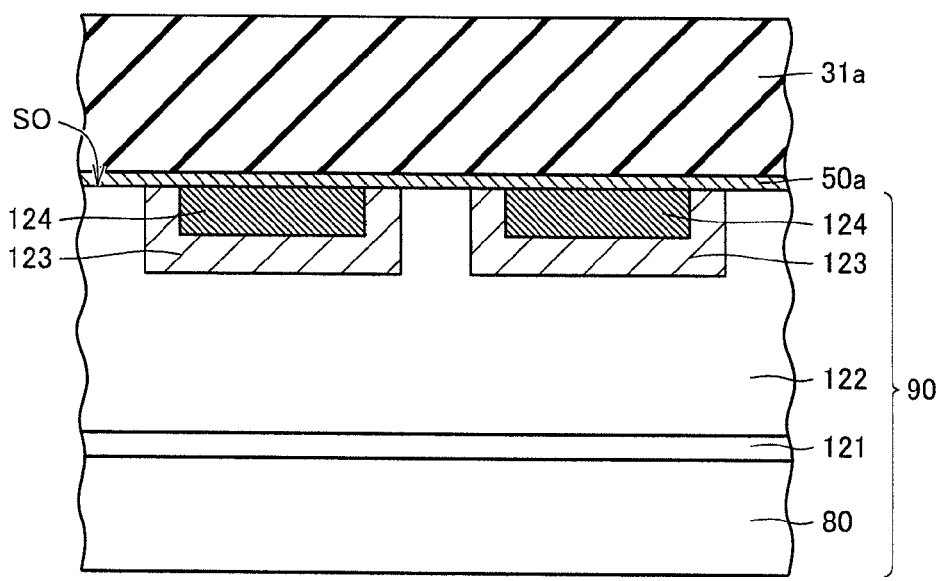
FIG. 23 is a partial cross-sectional view schematically showing a thirteenth step in the method of manufacturing a silicon carbide semiconductor device in FIG. 22.

As shown in FIG. 23, an etching stop layer 50a is formed on surface SO. Etching stop layer 50a is formed similarly to etching stop layer 50 described above. Then, a mask layer 31a is formed on etching stop layer 50a. Mask layer 31a can be formed similarly to mask layer 31 described above.

Figure 24:
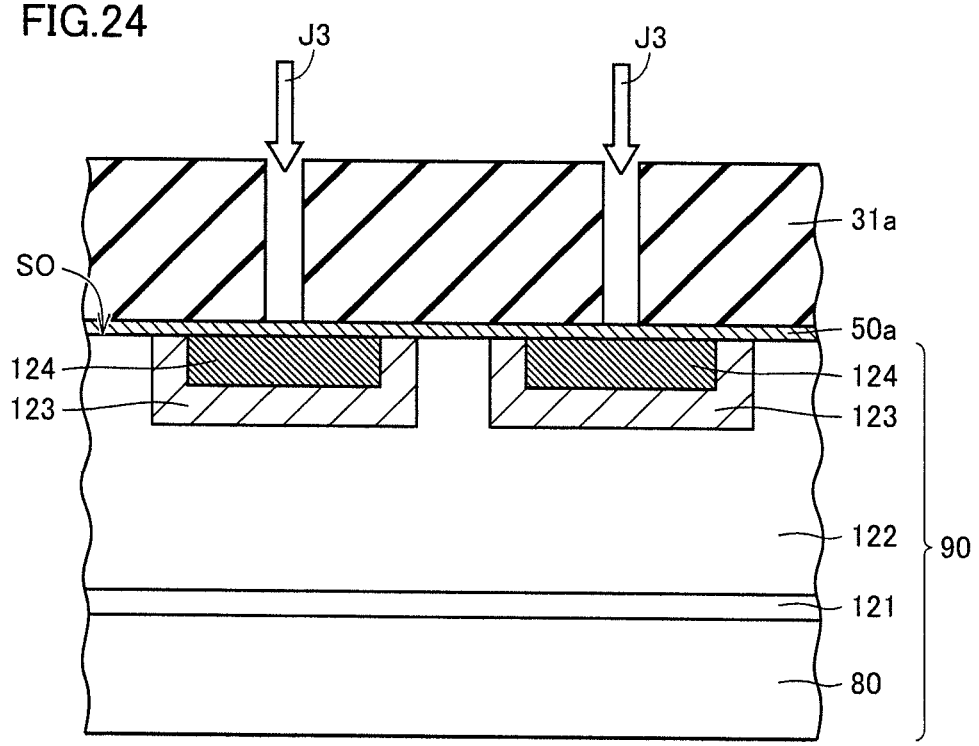
FIG. 24 is a partial cross-sectional view schematically showing a fourteenth step in the method of manufacturing a silicon carbide semiconductor device in FIG. 22.

As shown in FIG. 24, an opening is formed in mask layer 31a. This opening exposes a part of etching stop layer 50a in a two-dimensional view (a field of view from above in FIG. 24). A portion of etching stop layer 50a exposed through this opening is surrounded by a portion not exposed through this opening. Then, ion implantation J3 into epitaxial substrate 90 through this opening is performed.

Figure 25:
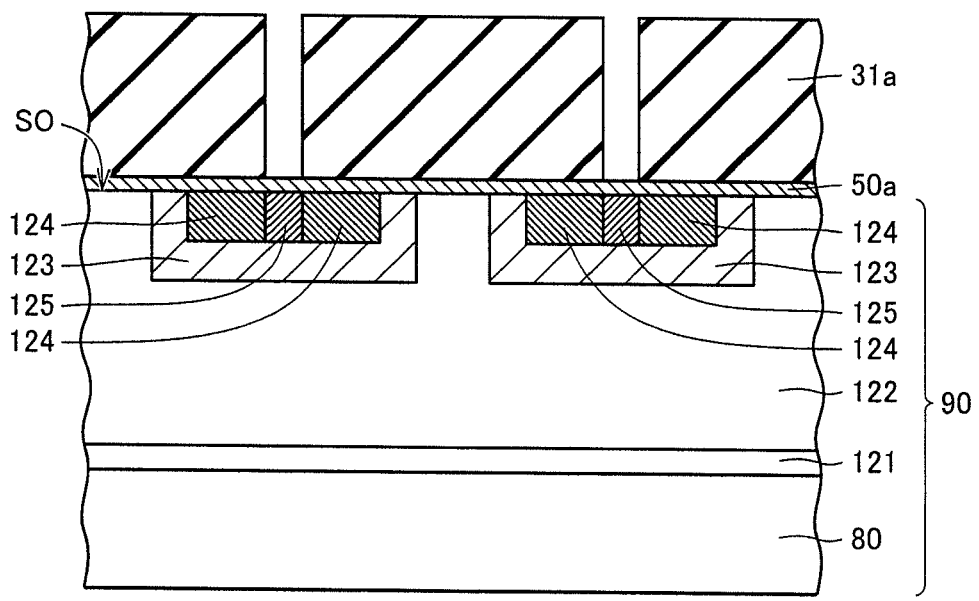
FIG. 25 is a partial cross-sectional view schematically showing a fifteenth step in the method of manufacturing a silicon carbide semiconductor device in FIG. 22.

As shown in FIG. 25, as a result of ion implantation above, p+ region 125 is formed in epitaxial substrate 90.

Figure 26:
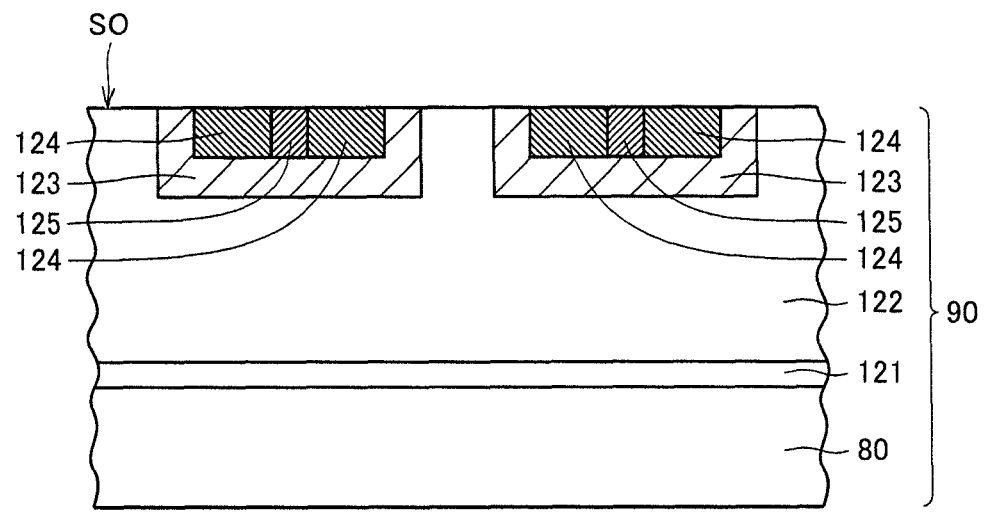
FIG. 26 is a partial cross-sectional view schematically showing a sixteenth step in the method of manufacturing a silicon carbide semiconductor device in FIG. 22.

As shown in FIG. 26, thereafter, mask layer 31a and etching stop layer 50a are removed. In addition, activation annealing treatment is performed. For example, annealing for 30 minutes at a heating temperature of 1700° C. in an argon atmosphere is performed. It is noted that annealing in the step in FIG. 13 can be omitted by performing this annealing step.

Figure 27:
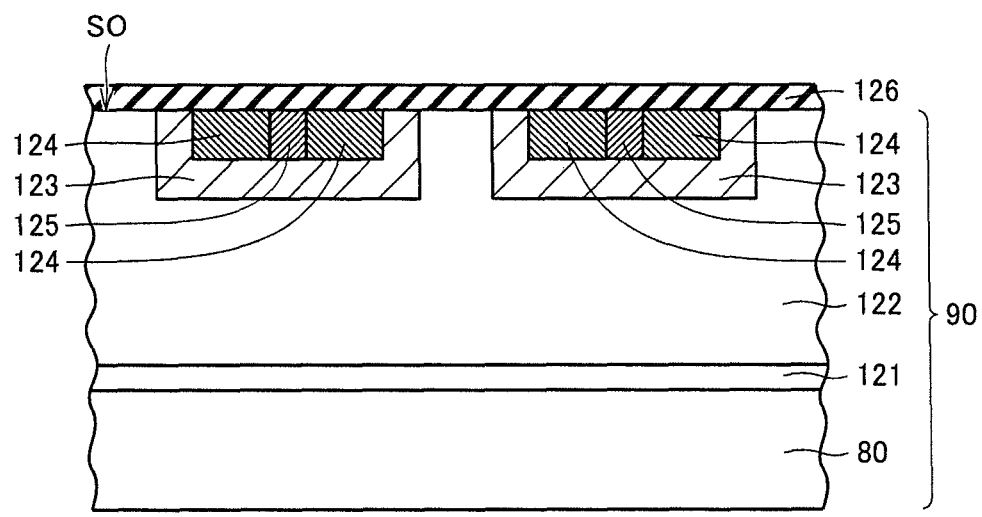
FIG. 27 is a partial cross-sectional view schematically showing a seventeenth step in the method of manufacturing a silicon carbide semiconductor device in FIG. 22.
Figure 28:
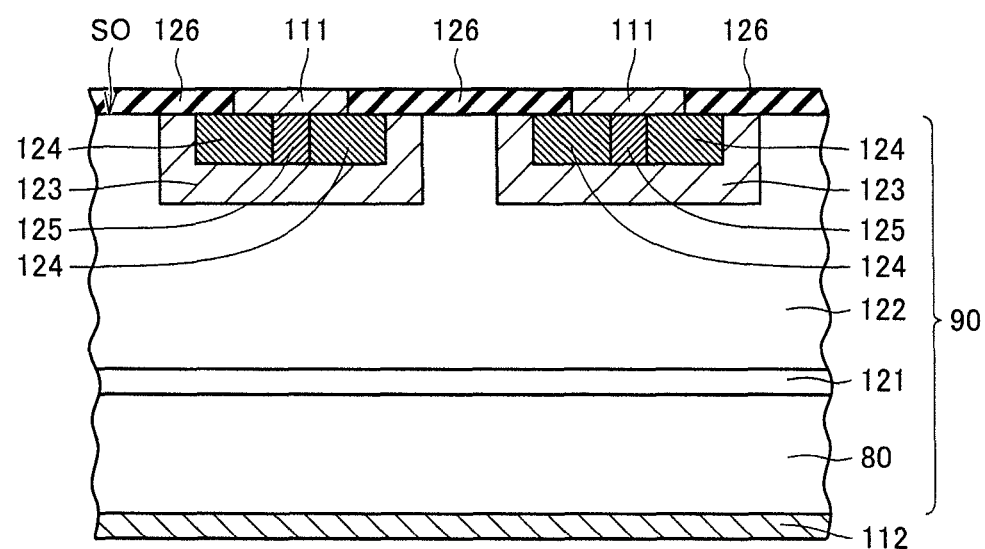
FIG. 28 is a partial cross-sectional view schematically showing an eighteenth step in the method of manufacturing a silicon carbide semiconductor device in FIG. 22.

As shown in each of FIGS. 27 and 28, the steps substantially the same as the steps in FIGS. 14 and 15 are performed.

MOSFET 300 (FIG. 22) is obtained as described above.

According to the present embodiment, as p region 123 is connected to source electrode 111 through p+ region 125, a potential of p region 123 is stabilized.

Though the steps substantially the same as the steps in FIGS. 2 to 13 in the first embodiment are performed in the former part of the manufacturing method in the present embodiment, steps substantially the same as the steps in FIGS. 19 to 21 in the second embodiment may be performed instead. In this case, p+ region 125 may be formed between n+ regions 124a and 124b (FIG. 21).

In each embodiment above, p-type and n-type may be interchanged. In addition, in each embodiment above, though epitaxial substrate 90 is employed as the silicon carbide substrate, a silicon carbide single crystal substrate may be employed instead.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a silicon carbide semiconductor device, comprising the steps of:
    preparing a silicon carbide substrate having a surface;
    forming an etching stop layer on said surface of said silicon carbide substrate;
    depositing a mask layer on said etching stop layer;
    forming a first opening surrounded by a first sidewall in said mask layer;
    forming a first impurity region having a first conductivity type from said surface to a first depth in said silicon carbide substrate by ion implantation through said first opening;
    forming a mask portion having said mask layer and a spacer layer by depositing said spacer layer on said etching stop layer on which said mask layer has been provided, after said step of forming a first impurity region, said spacer layer covering said first sidewall and said etching stop layer in said first opening;
    forming a second opening surrounded by a second sidewall in said mask portion by anisotropically etching said spacer layer in said first opening; and
    forming a second impurity region having a second conductivity type different from said first conductivity type from said surface to a second depth smaller than said first depth in said silicon carbide substrate, by ion implantation through said second opening, said second sidewall having a substantially uniform thickness across a height as great as said second depth,
    wherein an ion implantation angle in said step of forming a second impurity region is not smaller than 3° and not greater than 6°, and a surface of said silicon carbide substrate is a (0-33-8) plane of a hexagonal crystal.

2. The method of manufacturing a silicon carbide semiconductor device according to claim 1, further comprising the step of removing said mask portion after said step of forming a second impurity region.

3. The method of manufacturing a silicon carbide semiconductor device according to claim 2, further comprising the step of forming a gate insulating film and a gate electrode on said silicon carbide substrate after said step of removing said mask portion.

4. The method of manufacturing a silicon carbide semiconductor device according to claim 1, wherein
an angle of said first sidewall with respect to said surface is 90°±10° across a height as great as said first depth.

5. The method of manufacturing a silicon carbide semiconductor device according to claim 1, wherein
said second sidewall includes a portion of which angle with respect to said surface is 90°±10° and a height of said portion is not smaller than 0.5 µm and not greater than 2.5 µm.

6. The method of manufacturing a silicon carbide semiconductor device according to claim 1, wherein
said mask layer is made of any of silicon oxide and polysilicon.

7. The method of manufacturing a silicon carbide semiconductor device according to claim 1, wherein
said spacer layer is made of any of silicon oxide and polysilicon.

8. The method of manufacturing a silicon carbide semiconductor device according to claim 1, wherein
a material for said etching stop layer is different from a material for said mask layer.

9. The method of manufacturing a silicon carbide semiconductor device according to claim 8, wherein
said etching stop layer includes at least any of a silicon nitride layer, a polysilicon layer, a silicon oxide layer, a silicon oxynitride layer, and a titanium layer.

10. The method of manufacturing a silicon carbide semiconductor device according to claim 9, wherein
said etching stop layer has a thickness not smaller than 10 nm and not greater than 500 nm.

11. The method of manufacturing a silicon carbide semiconductor device according to claim 8, wherein
said etching stop layer includes a titanium layer, and
an underlying layer made of any of silicon oxide and polysilicon is further provided between said etching stop layer and said silicon carbide substrate.

12. The method of manufacturing a silicon carbide semiconductor device according to claim 1, further comprising the step of forming a third impurity region connecting said surface and said first impurity region to each other in said silicon carbide substrate, wherein
said third impurity region has said first conductivity type and it is higher in impurity concentration than said first impurity region.

13. A method of manufacturing a silicon carbide semiconductor device, comprising the steps of:
preparing a silicon carbide substrate having a surface;
forming an etching stop layer on said surface of said silicon carbide substrate;
depositing a mask layer on said etching stop layer;
forming a first opening surrounded by a first sidewall in said mask layer;
forming a first impurity region having a first conductivity type from said surface to a first depth in said silicon carbide substrate by ion implantation through said first opening;
forming a mask portion having said mask layer and a spacer layer by depositing said spacer layer on said etching stop layer on which said mask layer has been provided, after said step of forming a first impurity region, said spacer layer covering said first sidewall and said etching stop layer in said first opening;
forming a second opening surrounded by a second sidewall in said mask portion by anisotropically etching said spacer layer in said first opening; and
forming a second impurity region having a second conductivity type different from said first conductivity type from said surface to a second depth smaller than said first depth in said silicon carbide substrate, by ion implantation through said second opening, said second sidewall having a substantially uniform thickness across a height as great as said second depth,
wherein an ion implantation angle in said step of forming a second impurity region is 0°, and
a surface of said silicon carbide substrate is inclined by 3° or more from a {0001} plane of a hexagonal crystal in order to prevent a channeling phenomenon during ion implantation.

14. A method of manufacturing a silicon carbide semiconductor device, comprising the steps of:
preparing a silicon carbide substrate having a surface;
forming an etching stop layer on said surface of said silicon carbide substrate;
depositing a mask layer on said etching stop layer;
forming a first opening surrounded by a first sidewall in said mask layer;
forming a first impurity region having a first conductivity type from said surface to a first depth in said silicon carbide substrate by ion implantation through said first opening;
forming a mask portion having said mask layer and a spacer layer by depositing said spacer layer on said etching stop layer on which said mask layer has been provided, after said step of forming a first impurity region, said spacer layer covering said first sidewall and said etching stop layer in said first opening;
forming a second opening surrounded by a second sidewall in said mask portion by anisotropically etching said spacer layer in said first opening; and
forming a second impurity region having a second conductivity type different from said first conductivity type from said surface to a second depth smaller than said first depth in said silicon carbide substrate, by ion implantation through said second opening, said second sidewall having a thickness capable of suppressing introduction of ions into said silicon carbide substrate through said mask portion across a height as great as said second depth,
wherein an ion implantation angle in said step of forming a second impurity region is not smaller than 3° and not greater than 6°, and
a surface of said silicon carbide substrate is a (0-33-8) plane of a hexagonal crystal.

15. A method of manufacturing a silicon carbide semiconductor device, comprising the steps of:
preparing a silicon carbide substrate having a surface;
forming an etching stop layer on said surface of said silicon carbide substrate;
depositing a mask layer on said etching stop layer;

forming a first opening surrounded by a first sidewall in said mask layer;

forming a first impurity region having a first conductivity type from said surface to a first depth in said silicon carbide substrate by ion implantation through said first opening;

forming a mask portion having said mask layer and a spacer layer by depositing said spacer layer on said etching stop layer on which said mask layer has been provided, after said step of forming a first impurity region, said spacer layer covering said first sidewall and said etching stop layer in said first opening;

forming a second opening surrounded by a second sidewall in said mask portion by anisotropically etching said spacer layer in said first opening; and forming a second impurity region having a second conductivity type different from said first conductivity type from said surface to a second depth smaller than said first depth in said silicon carbide substrate, by ion implantation through said second opening, said second sidewall having a thickness capable of suppressing introduction of ions into said silicon carbide substrate through said mask portion across a height as great as said second depth, an ion implantation angle in said step of forming a second impurity region is not smaller than 3° and not greater than 6°, and a surface of said silicon carbide substrate is a (0-33-8) plane of a hexagonal crystal, wherein an ion implantation angle in said step of forming a second impurity region is 0°, and a surface of said silicon carbide substrate is inclined by 3° or more from a {0001} plane of a hexagonal crystal in order to prevent a channeling phenomenon during ion implantation.

\* \* \* \* \*